(12) United States Patent
Vu et al.

(10) Patent No.: US 7,078,788 B2
(45) Date of Patent: Jul. 18, 2006

(54) MICROELECTRONIC SUBSTRATES WITH INTEGRATED DEVICES

(75) Inventors: Quat T. Vu, Santa Clara, CA (US); Jian Li, Sunnyvale, CA (US); Steven Towle, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/964,238

(22) Filed: Oct. 13, 2004

(65) Prior Publication Data

US 2005/0062173 A1    Mar. 24, 2005

Related U.S. Application Data

(63) Continuation of application No. 09/884,595, filed on Jun. 18, 2001, now abandoned, which is a continuation-in-part of application No. 09/692,908, filed on Oct. 19, 2000, now Pat. No. 6,734,534, which is a continuation-in-part of application No. 09/640,961, filed on Aug. 16, 2000, now abandoned.

(51) Int. Cl.
*H05K 3/34* (2006.01)
*H05K 7/02* (2006.01)
*H01L 23/34* (2006.01)
*H01L 23/28* (2006.01)

(52) U.S. Cl. .................. 257/668; 257/723; 257/686; 257/701; 257/700; 257/774; 257/758; 257/680; 257/673; 257/782; 257/684; 257/698; 257/691; 257/692; 174/52.1; 174/52.2; 174/52.3; 174/52.4

(58) Field of Classification Search ............... 257/782, 257/774, 680, 723, 700–703, 684–686, 690–693, 257/696, 698, 796, 668, 777; 174/52.1, 52.2, 174/52.3, 52.4
See application file for complete search history.

(56) References Cited

U.S. PATENT DOCUMENTS

| | | | |
|---|---|---|---|
| 3,343,255 | A | 9/1967 | Donovan et al. |
| 3,407,479 | A | 10/1968 | Fordernwalt et al. |
| 3,903,590 | A | 9/1975 | Yokogawa |
| 4,400,870 | A | 8/1983 | Islam |

(Continued)

FOREIGN PATENT DOCUMENTS

DE    2425626    12/1975

(Continued)

OTHER PUBLICATIONS

*Patents Abstracts of Japan*, vol. 011, No. 171, No. 171 (E512), Jun. 2, 1987 -& JP 62 004351 A (Toshiba Corp.), Jan. 10, 1987 abstract.

(Continued)

Primary Examiner—Alexander Oscar Williams
(74) Attorney, Agent, or Firm—Schwegman, Lundberg, Woessner & Kluth, P.A.

(57) ABSTRACT

A microelectronic substrate including at least one microelectronic device disposed within an opening in a microelectronic substrate core, wherein an encapsulation material is disposed within portions of the opening not occupied by the microelectronic devices, or a plurality microelectronic devices encapsulated without the microelectronic substrate core. At least one conductive via extended through the substrate, which allows electrical communication between opposing sides of the substrate. Interconnection layers of dielectric materials and conductive traces are then fabricated on the microelectronic device, the encapsulation material, and the microelectronic substrate core (if present) to form the microelectronic substrate.

9 Claims, 12 Drawing Sheets

U.S. PATENT DOCUMENTS

| | | | |
|---|---|---|---|
| 4,731,700 A | 3/1988 | Woodward et al. | |
| 5,013,871 A | 5/1991 | Mahulikar et al. | |
| 5,048,179 A * | 9/1991 | Shindo et al. | 29/840 |
| 5,049,980 A | 9/1991 | Saito et al. | |
| 5,111,278 A | 5/1992 | Eichelberger | |
| 5,250,843 A | 10/1993 | Eichelberger | |
| 5,291,066 A | 3/1994 | Neugebauer et al. | |
| 5,324,687 A | 6/1994 | Wojnarowski | |
| 5,353,195 A | 10/1994 | Fillion et al. | |
| 5,353,498 A | 10/1994 | Fillion et al. | |
| 5,359,496 A | 10/1994 | Kornrumpf et al. | |
| 5,384,955 A | 1/1995 | Booth et al. | |
| 5,409,865 A | 4/1995 | Karnezos | |
| 5,422,513 A | 6/1995 | Marcinkiewicz et al. | |
| 5,455,457 A | 10/1995 | Kurokawa | |
| 5,457,299 A | 10/1995 | Blais et al. | |
| 5,497,033 A | 3/1996 | Fillion et al. | |
| 5,514,906 A | 5/1996 | Love et al. | |
| 5,527,741 A | 6/1996 | Cole et al. | |
| 5,696,666 A | 12/1997 | Miles et al. | |
| 5,703,400 A | 12/1997 | Wojnarowski et al. | |
| 5,745,984 A | 5/1998 | Cole, Jr. et al. | |
| 5,801,070 A | 9/1998 | Zanini-Fisher et al. | |
| 5,841,193 A * | 11/1998 | Eichelberger | 257/723 |
| 5,856,705 A | 1/1999 | Ting | |
| 5,889,654 A | 3/1999 | Pierson et al. | |
| 5,894,108 A | 4/1999 | Mostafazadeh et al. | |
| 5,895,229 A | 4/1999 | Carney et al. | |
| 5,977,639 A | 11/1999 | Seshan et al. | |
| 5,998,859 A | 12/1999 | Griswold et al. | |
| 6,013,953 A | 1/2000 | Nishihara et al. | |
| 6,025,995 A | 2/2000 | Marcinkiewicz | |
| 6,091,250 A | 7/2000 | Wood et al. | |
| 6,117,704 A | 9/2000 | Yamaguchi et al. | |
| 6,127,833 A | 10/2000 | Wu et al. | |
| 6,154,366 A | 11/2000 | Ma et al. | |
| 6,160,311 A | 12/2000 | Chen et al. | |
| 6,180,881 B1 | 1/2001 | Isaak | |
| 6,184,570 B1 | 2/2001 | MacDonald et al. | |
| 6,221,694 B1 | 4/2001 | Bhatt et al. | |
| 6,232,667 B1 | 5/2001 | Hultmark et al. | |
| 6,239,482 B1 | 5/2001 | Fillion et al. | |
| 6,265,759 B1 | 7/2001 | DiStefano et al. | |
| 6,271,469 B1 * | 8/2001 | Ma et al. | 174/52.4 |
| 6,274,391 B1 | 8/2001 | Wachtler et al. | |
| 6,288,905 B1 | 9/2001 | Chung | |
| 6,306,680 B1 | 10/2001 | Fillion et al. | |
| 6,320,127 B1 | 11/2001 | Nagarajan et al. | |
| 6,368,894 B1 | 4/2002 | Shen et al. | |
| 6,380,615 B1 | 4/2002 | Park et al. | |
| 6,389,689 B1 | 5/2002 | Heo | |
| 6,396,136 B1 | 5/2002 | Kalidas et al. | |
| 6,407,334 B1 | 6/2002 | Jimarez et al. | |
| 6,423,566 B1 | 7/2002 | Feger et al. | |
| 6,423,570 B1 | 7/2002 | Ma et al. | |
| 6,489,185 B1 * | 12/2002 | Towle et al. | 438/127 |
| 6,586,822 B1 | 7/2003 | Vu et al. | |
| 2001/0010627 A1 | 8/2001 | Akagawa | |
| 2002/0070443 A1 | 6/2002 | Mu et al. | |
| 2002/0074641 A1 | 6/2002 | Towle et al. | |
| 2002/0137263 A1 | 9/2002 | Towle et al. | |

FOREIGN PATENT DOCUMENTS

| | | |
|---|---|---|
| DE | 19539181 | 4/1997 |
| EP | 0110285 | 6/1984 |
| EP | 0246447 | 11/1987 |
| EP | 0579438 | 1/1994 |
| EP | 0604005 | 6/1994 |
| EP | 0938138 | 8/1999 |
| FR | 2572849 | 5/1986 |
| JP | 62004351 | 1/1987 |
| JP | 1217951 | 8/1989 |
| JP | 3-155144 | 7/1991 |
| JP | 03155144 | 7/1991 |
| JP | 555409 | 3/1993 |
| JP | 5206320 | 8/1993 |
| JP | 10092970 | 4/1998 |
| JP | 11045955 | 2/1999 |
| JP | 11-233678 | 8/1999 |
| JP | 11312868 | 11/1999 |
| WO | WO-99/56316 | 11/1999 |

OTHER PUBLICATIONS

Burdick, B., et al., "Extension of the Chip-on-Flex Technology to Known Good Die", *The International Journal of Microcircuits and Electronic Packaging*, 19, (1996),435-440.

IBM, "High Performance Package with Conductive Bonding", *IBM Technical Disclosure Bulletin*, (Mar. 1980),p. 4469-4470.

Pham, A, et al., "Development of a Millimeter-Wave System-on-a-Package Utilizing MCM Integration", *IEEE Transactions on Microwave Theory and Techniques*, 49, N.Y, U.S.,(2001),1747-1749.

* cited by examiner

MICROELECTRONIC SUBSTRATES WITH INTEGRATED DEVICES

RELATED APPLICATIONS

This is a continuation-in-part of application Ser. No. 09/692,908, filed Oct. 19, 2000, now issued as U.S. Pat. No. 6,734,534, which is a continuation-in-part of application Ser. No. 09/640,961, filed Aug. 16, 2000, now abandoned, which is a continuation of application Ser. No. 09/884,595, filed Jun. 18, 2001, now abandoned.

BACKGROUND OF THE INVENTION

1. Field of the Invention

The present invention relates to apparatus and processes for the fabrication of microelectronic substrates. In particular, the present invention relates to a fabrication technology that encapsulates at least one microelectronic device within a microelectronic substrate core or that encapsulates at least one microelectronic device (without a microelectronic substrate core) to form a two-sided microelectronic substrate or a two layer microelectronic substrate.

2. State of the Art

Substrates which connect individual microelectronic devices exist in virtually all recently manufactured electronic equipment. These substrates are generally printed circuit boards. Printed circuit boards are basically dielectric substrates with metallic traces formed in or upon the dielectric substrate. One type of printed circuit board is a single-sided board. As shown in FIG. 23, single-sided board 300 consists of a dielectric substrate 302, such as an FR4 material, epoxy resins, polyimides, triazine resins, and the like, having conductive traces 304, such as copper, aluminum, and the like, on one side (i.e., first surface 306), wherein the conductive traces 304 electrically interconnect microelectronic devices 308 (shown as flip-chips) attached to the first surface 306. However, single-sided boards 300 result in relatively long conductive traces 304, which, in turn, result in slower speeds and performance. Single-sided boards 300 also require substantial surface area for the routing of the conductive traces 304 to interconnect the various microelectronic devices 308, which increases the size of the resulting assembly.

It is, of course, understood that the depiction of the dielectric substrate 302, the conductive traces 304, and the microelectronic devices 308 in FIG. 23 (and subsequently FIGS. 24 and 25) are merely for illustration purposes and certain dimensions are greatly exaggerated to show the concept, rather than accurate details thereof.

Double-sided boards 310 were developed to help alleviate the problem with relatively long conductive traces. As shown in FIG. 24, the double-sided board 310 comprises a dielectric substrate 302 having conductive traces 304 on the dielectric substrate first surface 306 and on a dielectric substrate second surface 312. At least one electrically conductive via 314 extends through the dielectric substrate 302 to connect at least one conductive trace 304 on the first surface 306 with at least one conductive trace 304 on the second surface 312. Thus, the microelectronic devices 308 on the dielectric substrate first surface 306 and on the dielectric substrate second surface 312 may be in electrical communication. The electrically conductive vias 314 are generally plated through-hole vias and may be formed in any manner known in the art.

FIG. 25 illustrates another board design, known as a multi-layer board 320. A multi-layer board 320 comprises two or more pieces of dielectric material (shown as first dielectric material 322 and second dielectric material 324) with conductive traces 304 thereon and therebetween with electrically conductive vias 314 formed through the first dielectric material 322 and the second dielectric material 324. This design allows for shorter traces and reduced surface area requirements for conductive trace 304 routing.

Although such boards have been adequate for past and current microelectronic device applications, the need for higher performance and shorter traces of substrate boards increases as the speed and performance of the microelectronic devices increase. Therefore, it would be advantageous to develop new substrates/boards, which achieve higher speed and performance.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings, in which:

DETAILED DESCRIPTION OF THE ILLUSTRATED EMBODIMENT

Figure 1:
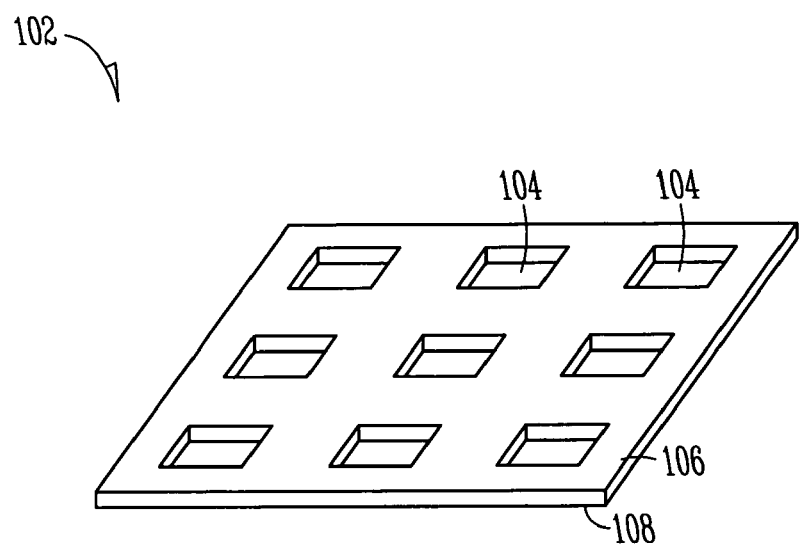
FIG. 1 is an oblique view of a microelectronic substrate core, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implement within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes a substrate fabrication technology that places at least one microelectronic device within at least one opening in a microelectronic substrate core and secures the microelectronic device(s) within the opening(s) with an encapsulation material or that encapsulates at least one microelectronic device within an encapsulation material without a microelectronic substrate core to form a microelectronic substrate. At least one conductive via extended through the substrate, which allows electrical communication between opposing sides of the substrate. Interconnection layers of dielectric materials and conductive traces are then fabricated on the microelectronic device(s), the encapsulation material, and the microelectronic substrate core (if present) to form a microelectronic substrate. Two microelectronic substrates may be attached to one another either before or after the formation of the interconnection layers.

The technical advantage of this invention is that it enables the microelectronic substrate to be built around the microelectronic device(s), which results in a shorter interconnect distance between microelectronic devices within the microelectronic substrate and other microelectronic devices attached thereto. This, in turn, results in higher speed and performance. Furthermore, the microelectronic substrate of the present invention may also result in a smaller form factor, which is well suited to mobile systems (i.e., laptop computers, handheld devices, personal digital assistants, etc.).

Figure 2:
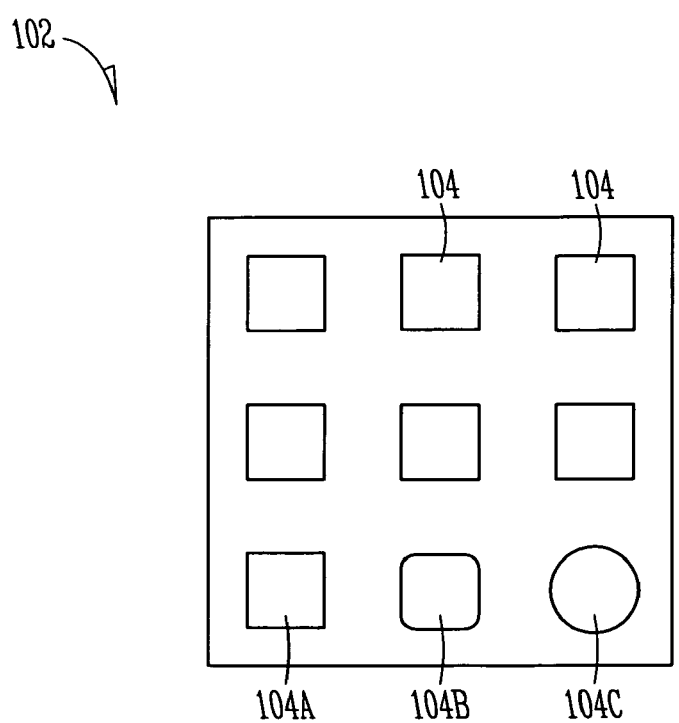
FIG. 2 is a top plan view of a microelectronic substrate core having examples of alternate microelectronic substrate core openings, according to the present invention.

FIG. 1 illustrates a microelectronic substrate core 102 used to fabricate a microelectronic substrate. The microelectronic substrate core 102 preferably comprises a substantially planar material. The material used to fabricate the microelectronic substrate core 102 may include, but is not limited to, a Bismaleimide Triazine ("BT") resin based laminate material, an FR4 laminate material (a flame retarding glass/epoxy material), various polyimide laminate materials, ceramic material, and the like, and metallic materials (such as copper) and the like. The microelectronic substrate core 102 has at least one opening 104 extending therethrough from a first surface 106 of the microelectronic substrate core 102 to an opposing second surface 108 of the microelectronic substrate core 102. As shown in FIG. 2, the opening(s) 104 may be of any shape and size including, but not limited to, rectangular/square 104a, rectangular/square with rounded corners 104b, and circular 104c. The only limitation on the size and shape of the opening(s) 104 is that they must be appropriately sized and shaped to house a corresponding microelectronic device therein, as will be discussed below. It is, of course, understood that the openings 104 need not be in a regular array/spacing, but may be placed wherever desired within the microelectronic substrate core 102.

Figure 3:
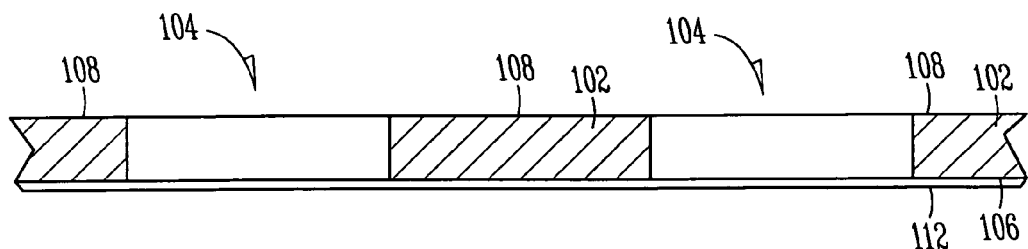
FIG. 3 is a side cross-sectional view of a microelectronic substrate core abutted to a protective film, according to the present invention.
Figure 4:
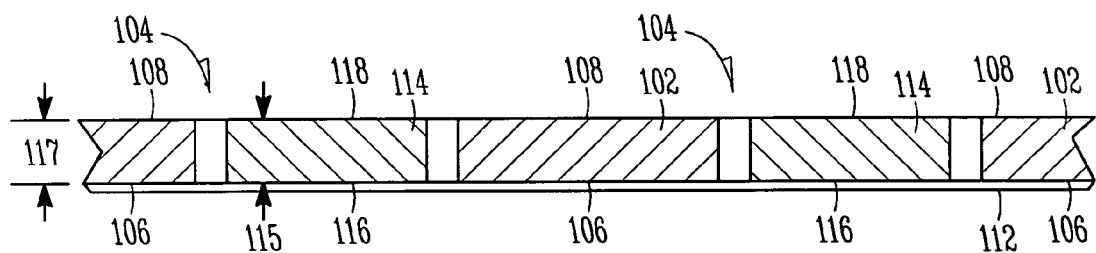
FIG. 4 is a side cross-sectional view of microelectronic devices disposed within openings of the microelectronic substrate core, which also abuts the protective film, according to the present invention.

FIG. 3 illustrates the microelectronic substrate core first surface 106 abutting a protective film 112. The protective film 112 is preferably a substantially flexible material, such as Kapton® polyimide film (E.I. du Pont de Nemours and Company, Wilmington, Del.), but may be made of any appropriate material, including metallic films. In a preferred embodiment, the protective film 112 would have substantially the same coefficient of thermal expansion (CTE) as the microelectronic substrate core. FIG. 4 illustrates microelectronic device 114, each having an active surface 116 and a back surface 118, placed in corresponding openings 104 of the microelectronic substrate core 102. The microelectronic device 114 may be any known active or passive microelectronic device including, but not limited to, logic (CPUs), memory (DRAM, SRAM, SDRAM, etc.), controllers (chip sets), capacitors, resistors, inductors, and the like.

In a preferred embodiment (illustrated), the thickness 117 of the microelectronic substrate core 102 and the thickness 115 of the microelectronic device 114 are substantially equal. The microelectronic device 114 are each placed such that their active surfaces 116 abut the protective film 112. The protective film 112 may have an adhesive, such as silicone or acrylic, which attaches to the microelectronic substrate core first surface 106 and the microelectronic device active surface 116. This adhesive-type film may be applied prior to placing the microelectronic device 114 and microelectronic substrate core 102 in a mold, liquid dispense encapsulation system (preferred), or other piece of equipment used for the encapsulation process. The protective film 112 may also be a non-adhesive film, such as a ETFE (ethylene-tetrafluoroethylene) or Teflon® film, which is held on the microelectronic device active surface 116 and the microelectronic substrate core first surface 106 by an inner surface of the mold or other piece of equipment during the encapsulation process.

Figure 5:
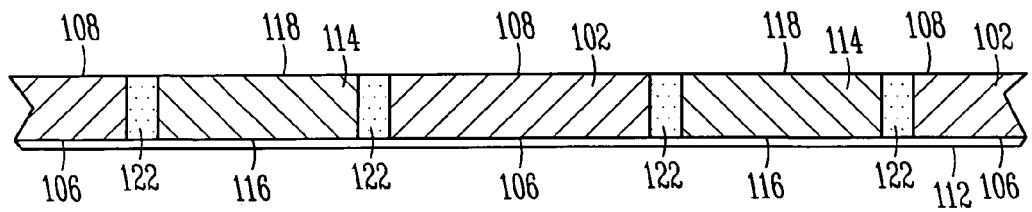
FIG. 5 is a side cross-sectional view of the assembly of FIG. 4 after encapsulation, according to the present invention.

The microelectronic device 114 is then encapsulated with an encapsulation material 122, such as plastics, resins, epoxies, elastomeric (i.e., rubbery) materials, and the like. As shown in FIG. 5, the encapsulation material 122 is disposed in portions of the opening(s) 104 not occupied by the microelectronic device 114. The encapsulation of the microelectronic device 114 may be achieved by any known process, including but not limited to transfer and compression molding, and dispensing. The encapsulation material 122 secures the microelectronic device 114 within the microelectronic substrate core 102 and provides mechanical rigidity for the resulting structure and provides surface area for the subsequent build-up of trace layers.

Figure 6:
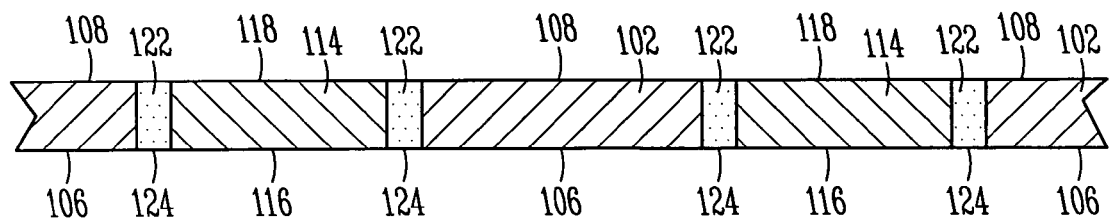
FIG. 6 is a side cross-sectional view of the assembly of FIG. 5 after the protective film has been removed, according to the present invention.

After encapsulation, the protective film 112 is removed, as shown in FIG. 6, to expose the microelectronic device active surface 116, thereby forming a first substrate 130. As also shown in FIG. 6, the encapsulation material 122 is preferably forms at least one surface 124 that is substantially planar to the microelectronic device active surface 116 and the microelectronic substrate core first surface 106. The encapsulation material surface 124 may be utilized in further fabrication steps, along with the microelectronic substrate core first surface 106, as additional surface area for the formation of interconnection layers, such as dielectric material layers and conductive traces.

Figure 7:
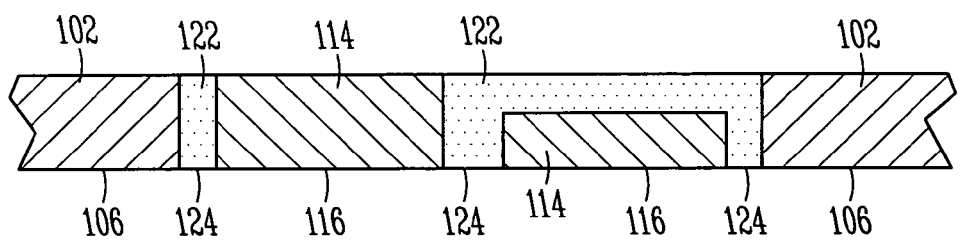
FIG. 7 is a side cross-sectional view of multiple microelectronic devices within a single core opening.
Figure 8:
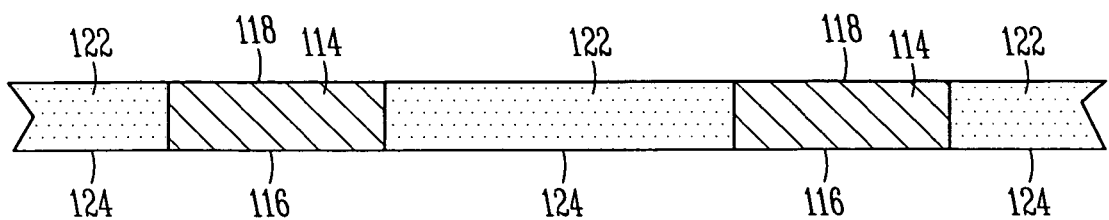
FIG. 8 is a side cross-sectional view of the assembly of FIG. 6 without a microelectronic substrate core, according to the present invention.

As shown in FIG. 7, a plurality of microelectronic devices 114 of various sizes could be placed in each microelectronic substrate core opening 104 and encapsulated with encapsulation material 122. It is also understood that the microelectronic substrate core 102 is optional. The first substrate 130 could be fabricated with the microelectronic devices 114 merely encapsulated with encapsulation material 122, as shown in FIG. 8.

Figure 9:
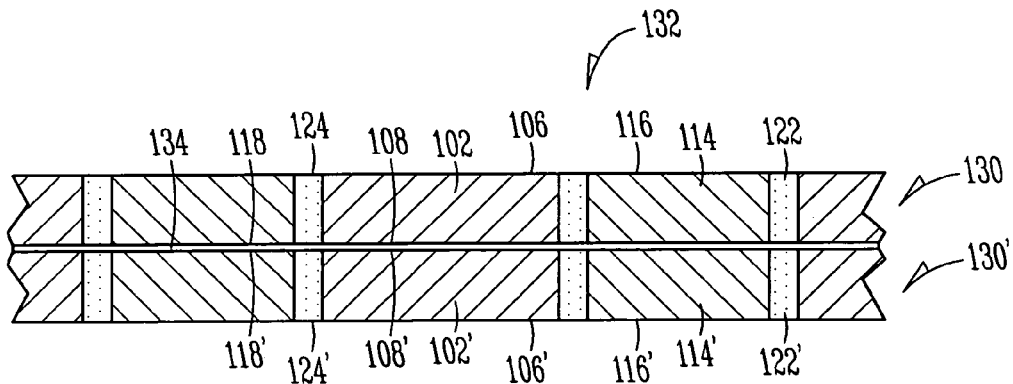
FIG. 9 is a dual substrate assembly, according to the present invention.

FIG. 9 illustrates a dual substrate assembly 132, according to the present invention, comprising the first substrate 130 attached to a second substrate 130'. The second substrate 130' has components similar to those illustrated for first substrate 130 in FIG. 6, wherein like components are differentiated by a prime (') designation. The first substrate 130 and the second substrate 130' are attached to one another such that the first microelectronic substrate core second surface 108 and the first microelectronic device back surfaces 118 are placed adjacent a second microelectronic substrate core second surface 108' and a second microelectronic device back surface 118' to form the dual substrate assembly 132. The attachment of the first substrate 130 to the second substrate 130' may be achieved with a layer adhesive 134, or by any attachment technique as will be evident to those skilled in the art. While the first substrate 130 and the second substrate are shown for simplicity to be exactly alike in FIG. 9, they do not have to be so. Similarly, for simplicity, FIGS. 10–17 (except FIG. 16) show symmetrical configurations. In practice, they could be dissimilar, as shown in FIG. 16.

Figure 10:
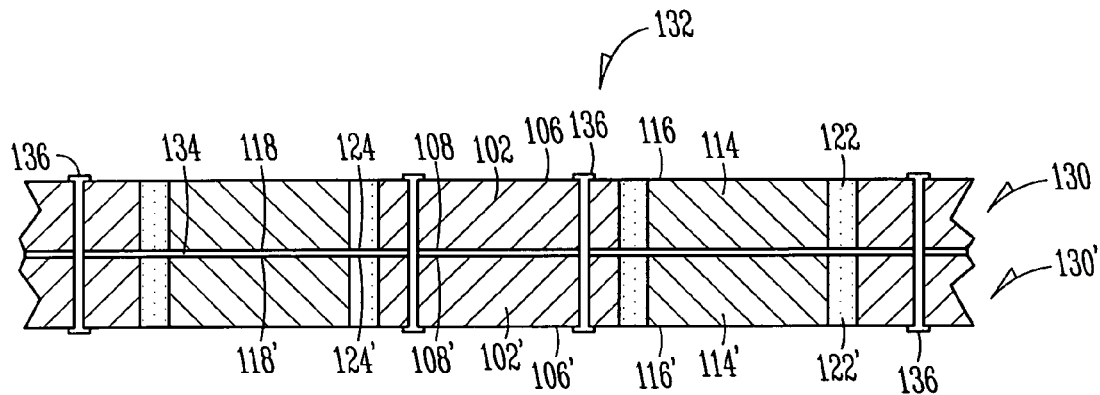
FIG. 10 illustrates the dual substrate assembly of FIG. 9 having conductive via formed therethrough, according to the present invention.

As shown in FIG. 10, at least one conductive via 136 is formed through the microelectronic substrate core 102 and the second microelectronic substrate core 102' by drilling holes therethrough and plating or filling the holes with a conductive material such as copper, aluminum, and the like. Such conductive vias 136 are used to achieve electrical communication between at least one of the first substrate microelectronic devices 114 and at least one of the second substrate microelectronic devices 114' and/or between microelectronic components which may be mounted on interconnection layers which will be formed on the microelectronic device active surfaces 116, 116', the microelectronic substrate core first surfaces 106, 106', and the encapsulation material surfaces 124, 124' of the first substrate 130 and the second substrate 130', respectively, as will be discussed. If the substrate core is made of a conductive material, a dielectric material will need to be disposed between the conducting material and the conductive via material, by one of various techniques which are known in the art.

Although the following description relates to a bumpless, built-up layer technique for the formation of interconnection layers, the method of fabrication is not so limited. The interconnection layers may be fabricated by a variety of techniques known in the art.

Figure 11:
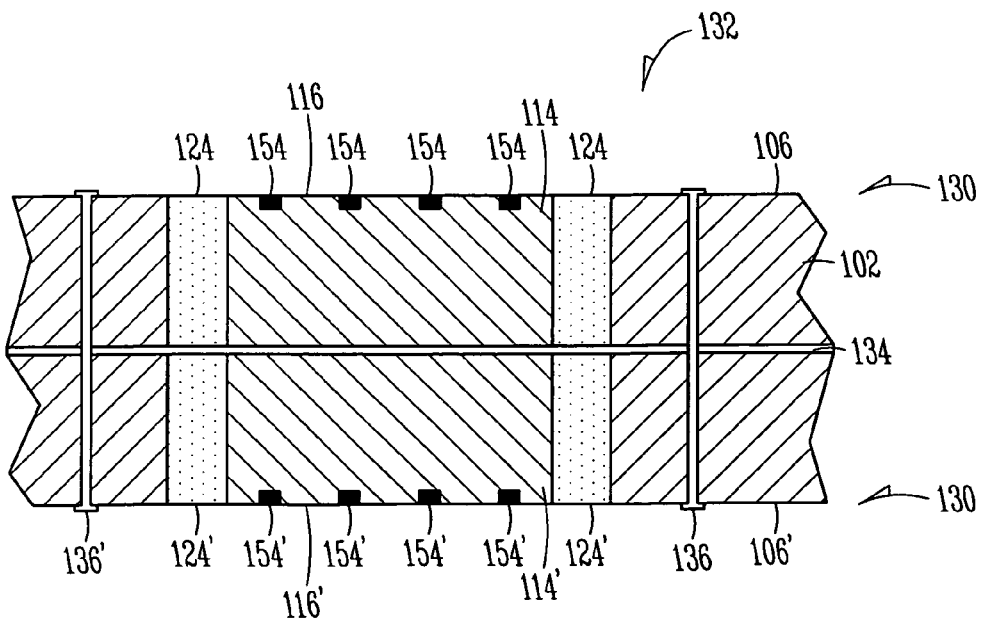
FIG. 11 is an enlarged view of the dual substrate assembly of FIG. 10, according to the present invention.

FIG. 11 illustrates an enlarged view of the dual substrate assembly 132 of FIG. 10, wherein the first substrate 130 and the second substrate 130' each have a microelectronic device (114, 114') encapsulated within their microelectronic substrate cores (102, 102'), respectively. Each of the microelectronic device 114, 114', of course, includes a plurality of electrical contacts 154, 154' located on their microelectronic device active surfaces 116, 116', respectively. The electrical contacts 154, 154' are electrically connected to circuitry (not shown) within each microelectronic device 114, 114', respectively. Only four electrical contacts 154, 154' are shown on each microelectronic device 114, 114' for sake of simplicity and clarity. It is, of course, understood that any number of electrical contacts could be present.

Figure 12:
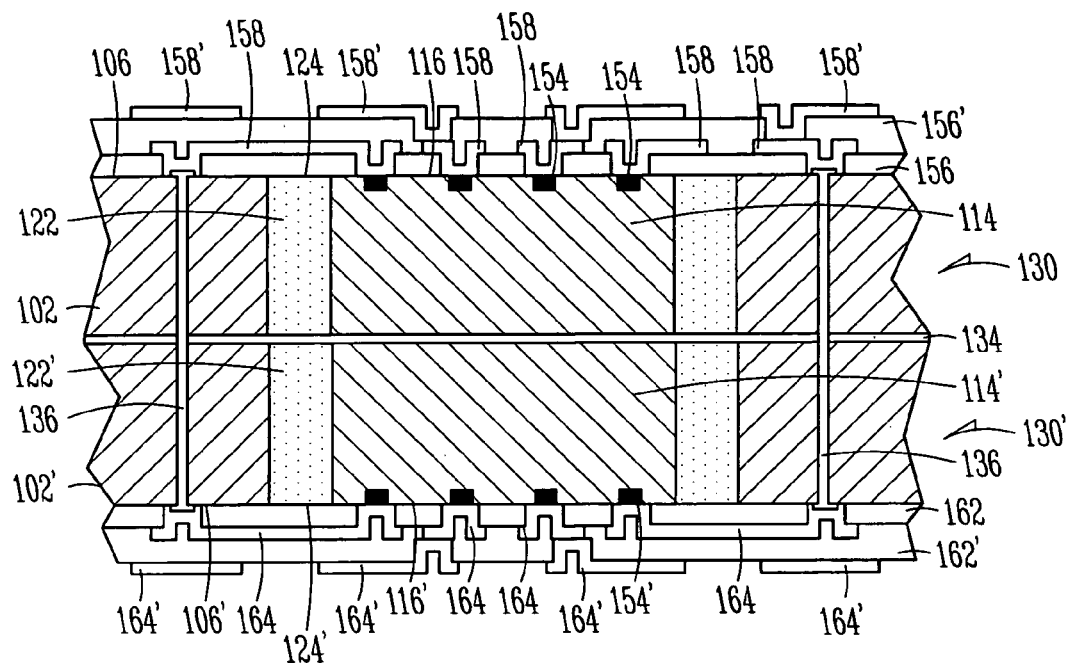
FIG. 12 illustrates the dual substrate assembly of FIG. 11 having interconnection layers formed on opposing surfaces thereof, according to the present invention.

As shown in FIG. 12, dielectric layers 156, 156', and conductive traces 158, 158' are layered, respectively, over the microelectronic device active surface 116 (including the electrical contacts 154), the microelectronic substrate core first surface 106, and the encapsulation material surface 124. Dielectric layers 162, 162', and conductive traces 164, 164' are layered, respectively, over the microelectronic device active surface 116' (including the electrical contacts 154'), the microelectronic substrate core first surface 106', and the encapsulation material surface 124'. At least one conductive trace 158 may contact a first via 136, which in turn contacts a conductive trace 164 to achieve electrical contact between the first microelectronic device 114 and the second microelectronic device 114'.

The dielectric layers 156, 156', 162, 162' are preferably epoxy resin, polyimide, bisbenzocyclobutene, and the like, and more preferably filled epoxy resins available from Ibiden U.S.A. Corp., Santa Clara, Calif., U.S.A. and from Ajinomoto U.S.A., Inc., Paramus, N.J., U.S.A. The conductive traces 158, 158', 164, 164', may be any conductive material including, but not limited to, copper, aluminum, and alloys thereof.

The formation of the dielectric layers 156, 156', 162, 162' may be achieved by any known process, including but not limited to lamination, spin coating, roll coating, and spray-on deposition. The conductive traces 158, 158', 164, 164' may extend through their respective dielectric layers 156, 156', 162, 162' to make electrical contact with one another or with the electrical contacts 154, 154'. This is accomplish by forming vias through the dielectric layers 156, 156', 162, 162' (after the formation of each dielectric layer), by any method known in the art, including but not limited to laser drilling and photolithography (usually followed by an etch).

The conductive traces 158, 158', 164, 164' may be formed by any known technique, including but not limited to semi-additive plating and photolithographic techniques. Preferably, corresponding dielectric layers (i.e., 156 and 162, 156' and 162') and corresponding conductive traces (i.e., 158 and 164, 158' and 164') are formed simultaneous on both the first substrate 130 and the second substrate 130'. However, it is understood that they could be formed independently on each substrate.

Figure 13:
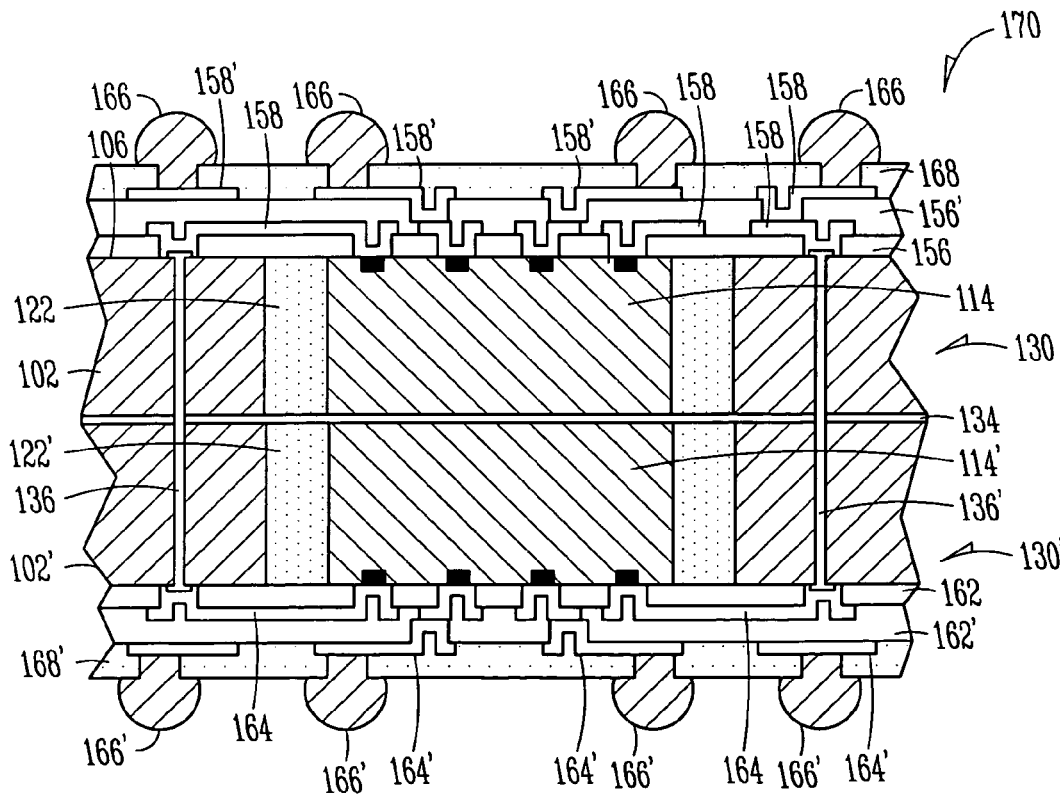
FIG. 13 illustrates the dual substrate assembly of FIG. 12 having conductive interconnects formed on the interconnection layers, according to the present invention.

As shown in FIG. 13, conductive interconnects 166, 166', such as solder bumps, solder balls, pins, and the like, may be formed to contact the conductive traces 158', 164', respectively, and used for communication with external components (not shown). FIG. 13 illustrates solder bumps extending through solder resist dielectric layers 168, 168' to form a layered microelectronic substrate 170.

It is, of course, understood that a variety of interconnection configurations may be devised. For example, as shown in the FIG. 13, at least one conductive trace 164 may contact a second via 136', which in turn contacts a conductive trace 158, 158' to achieve electrical contact between the first microelectronic device 114 and the conductive interconnect 166 on an opposing side of the layered microelectronic substrate 170.

Figure 14:
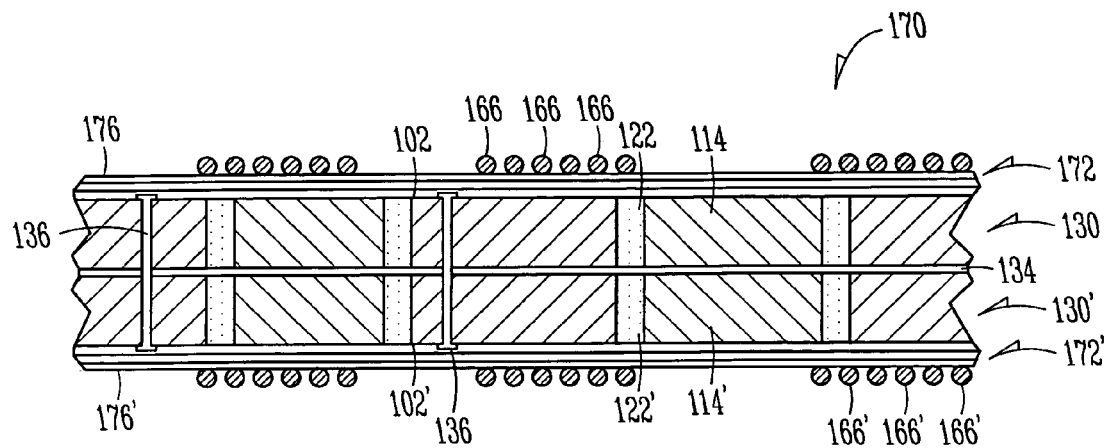
FIG. 14 is a view of FIG. 13 illustrating a plurality of the microelectronic devices encapsulated in each microelectronic substrate core, according to the present invention.

FIG. 14 illustrates a plurality of microelectronic devices 114, 114' respectively encapsulated with encapsulation material 122, 122' within the microelectronic substrate cores 102, 102' to form the layered microelectronic substrate 170 of the present invention. The layer(s) of dielectric material and conductive traces comprising the interconnection layer is simply designated together as interconnection layers 172, 172', respectively.

This interconnection layers 172, 172' serve not only to form connections between the microelectronic device 114, 114' and/or the plurality of conductive interconnects 166, 166', as described above, but also to allow electrical communication among the microelectronic devices 114 and among the microelectronic devices 114'.

Figure 15:
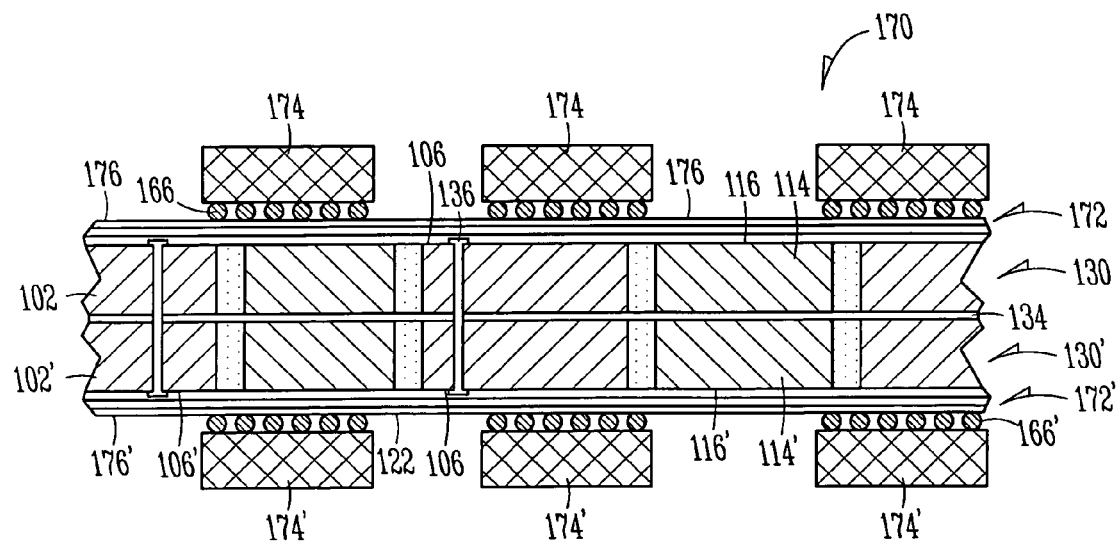
FIG. 15 illustrates microelectronic devices 174 and 174' attached to the assembly of FIG. 14, according to the present invention.
Figure 16:
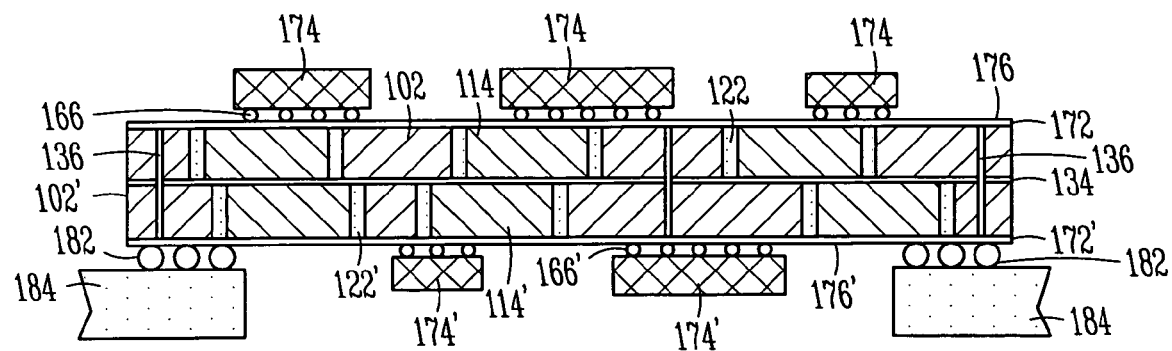
FIG. 16 illustrates the assembly of FIG. 15 attached to an external system board through external attachment feature, according to the present invention.
Figure 17:
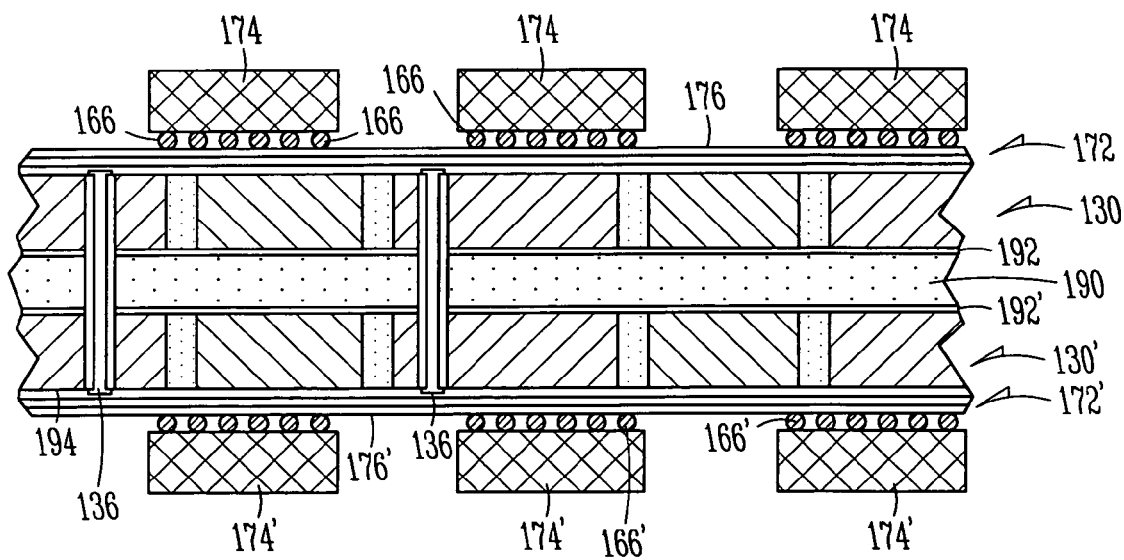
FIG. 17 illustrates the dual substrate assembly of FIG. 15 having a heat dissipation device between the first substrate and the second substrate, according to the present invention.

As shown in FIG. 15, once the interconnection layers 172, 172' are formed, at least one microelectronic device 174 may be attached to an exposed surface 176 of the interconnection layer 172 by the conductive interconnects 166 and/or at least one microelectronic device 174' may be attached to an exposed surface 176' of the interconnection layer 172' by the conductive interconnects 166'. It is, of course, understood that the conductive interconnects 166, 166' may be formed either on the interconnection layer 172, 172' (as shown in FIG. 11) or on the microelectronic devices 174, 174'. It is also understood that, although FIG. 15 illustrates the microelectronic devices 174, 174' as packaged flip-chips, the microelectronic devices may be any known active or passive microelectronic devices including, but not limited to, logic (CPUs), memory (DRAM, SRAM, SDRAM, etc.), controllers (chip sets), capacitors, resistors, and the like. Furthermore, in addition to flip-chip attachment, as illustrated in FIG. 15, attachment of the microelectronic devices 174, 174' may be accomplished by other methods, such as wirebonding or other methods known to those skilled in the art.

FIG. 16 illustrates the assembly of FIG. 15 including a plurality of the external attachment features 182, such as attach pins, solder balls (shown), or other such features, connected to the exposed surface 176' of the interconnection layer 172'. The external attachment features 182 make electrical connection between the layered microelectronic substrate 170 and an external system board 184.

Of course, the layered microelectronic substrate 170 would be most effective if the microelectronic devices 114, 114' did not require heat to be remove therefrom. However, if the microelectronic devices 114 do need heat removal, a heat dissipation device 190 may be disposed between the first substrate 130 and the second substrate 130', as illustrated FIG. 17. The heat dissipation device 190 may be a heat pipe, as known in the art, or a heat slug, such as a copper plate, an aluminum plate, a thermally conductive polymer, or a micro-electro-mechanical (MEMS) cooling system. The first substrate 130 and the second substrate 130' are preferably attached to the heat dissipation device 190 by layers 192, 192' of conductive adhesive material (respectively), such as thermally conductive epoxy, high thermal conductivity solder, and the like. During the fabrication of the conductive vias 136, holes are drilled through the first substrate 130, the heat dissipation device 190, and the second substrate 130'. If the heat dissipation device 190 is made of an electrically conductive material, the holes are coated with a thin conformal layer of dielectrical material 194, such as vapor deposition of a polymer, including but not limited to parylene. Another approach known in the art is to fill the via holes with dielectric material and drill a new smaller ole in the center. Thereafter, as previously discussed, a conductive material is plated or filled in the holes to form the conductive vias 136.

Figure 18:
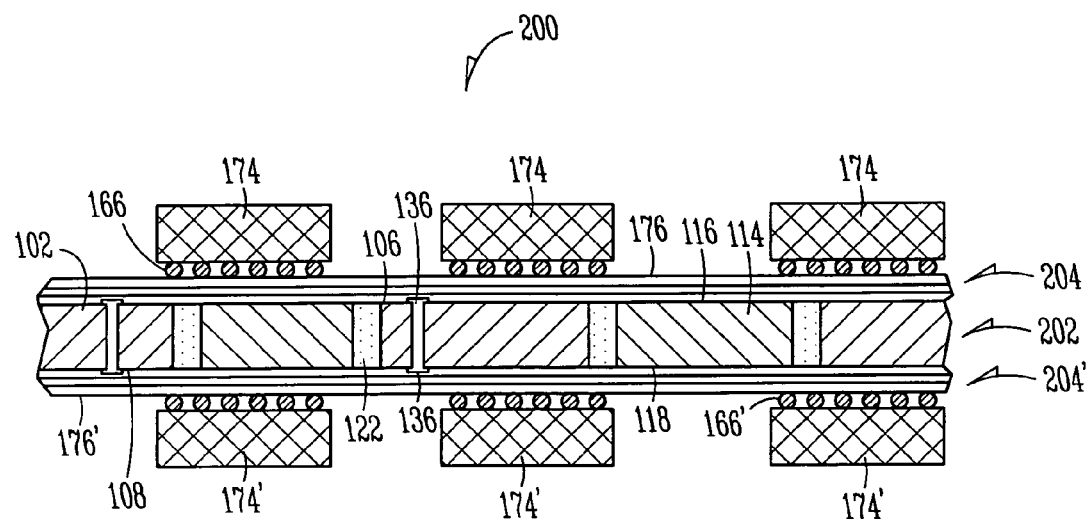
FIG. 18 is a single substrate microelectronic assembly, according to the present invention.
Figure 26:
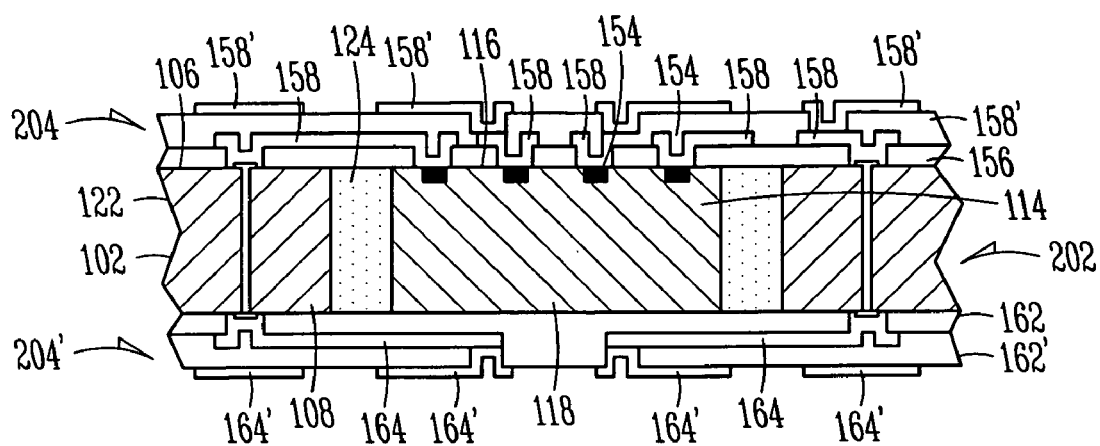
FIG. 26 is a single substrate microelectronic assembly, according to the present invention.

FIGS. 18 and 26 illustrate an embodiment of a single substrate microelectronic assembly 200, according to the present invention. The single substrate microelectronic assembly 200 comprises a single substrate 202 having a plurality of microelectronic devices 114 encapsulated in a microelectronic substrate core 102, as previously discussed. A plurality of the vias 136 is formed through the single substrate 202. A first interconnection layer 204 is formed on the microelectronic device active surfaces 116 and microelectronic substrate core first surface 106, and a second interconnection layer 204' is formed on the microelectronic device back surfaces 118 and microelectronic substrate core first surface 108, preferably, in the manner previously discussed. At least one microelectronic device 174 may be attached to an exposed surface 206 of the first interconnection layer 204 by conductive interconnects 208 and/or at least one microelectronic device 174' may be attached to the exposed surface 206' of the second interconnection layer 204' by conductive interconnects 208'.

Figure 19:
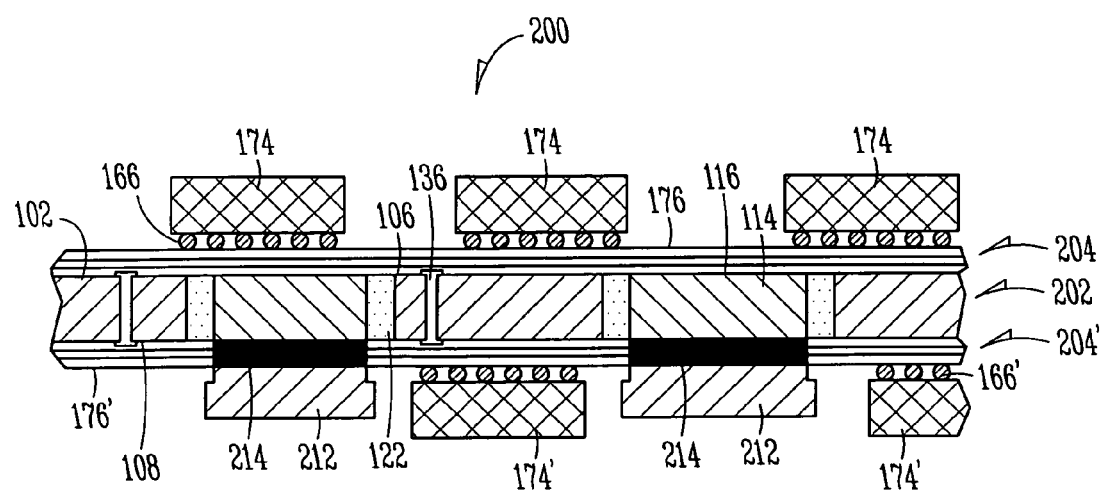
FIG. 19 illustrates the single substrate microelectronic assembly having heat dissipation devices attached to the back surface of the microelectronic devices encapsulated therein, according to the present invention.

If any of the embedded microelectronic devices 114 require heat removal, heat dissipation devices 212 may be placed in thermal contact with the microelectronic device back surfaces 118, as shown in FIG. 19. As part of the embedding process, the microelectronic device back surface 118 is exposed either by proper choice of embedding process or by backside grinding, prior to forming the interconnection layer(s) (shown with second interconnection layer 204'). The microelectronic device back surface 118 is preferably metallized during the build-up process used to form the conductive traces (see discussion regarding FIG. 12) of the second interconnection layer 204'when a metal is used. The metallized surfaces are illustrated as elements 214. The metallized surfaces 214 may be formed by having an open area of the dielectric patterning mask or by ablating away all of the dielectric with a laser at each layering step, as previously discussed. Of course, other techniques, as will be known to those skilled in the art, may be utilized.

Figure 20:
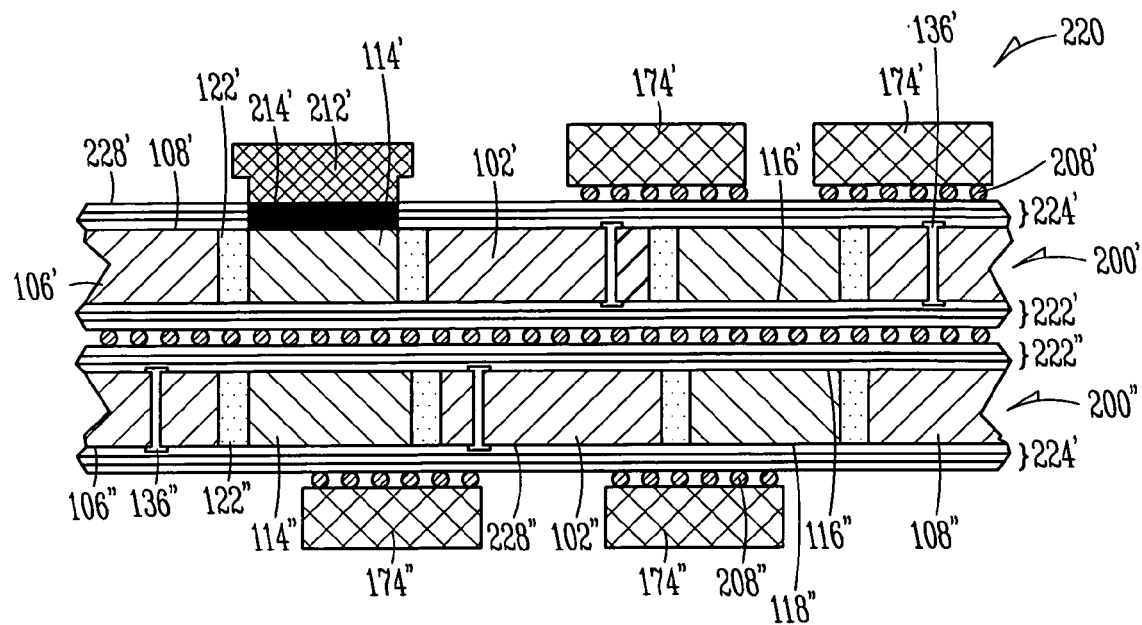
FIG. 20 illustrates multiple single substrate microelectronic assemblies of FIG. 19 interconnected to form a layered microelectronic substrate assembly, according to the present invention.

As shown in FIG. 20, more than one single substrate microelectronic substrate assembly 200, as shown in FIG. 19, may be layered to form a layered microelectronic substrate assembly, according to the present invention. The layered microelectronic assembly 220 is fabricated by orienting a first single substrate microelectronic substrate assembly 200' to a second single substrate microelectronic substrate assembly 200", such that the microelectronic device active surfaces 116' and 116", respectively, face one another. The interconnection layers 222' and 222", which are formed on the microelectronic device active surfaces 116' and 116" and the substrate core first surfaces 106' and 106' respectively, may be electrically interconnected by direct lamination, by a plurality of conductive interconnects 226, such as solder balls (shown), or by any other technique as will be known to those skilled in the art.

Interconnection layers 224' and 224" are formed on the microelectronic device back surfaces 118' and 118", and microelectronic substrate core second surface 108' and 108", respectively, in the manner previously discussed. At least one microelectronic device 174' may be attached to an exposed surface 228' of the interconnection layers 224' by conductive interconnections 208' and/or at least one microelectronic device 174" may be attached to the exposed surface 228" of the interconnection layer 224" by conductive interconnections 208". Of course, heat dissipation devices 212' and 212" (not shown) may be placed in thermal contact with the microelectronic device back surfaces 118' and 118", respectively. As previously discussed, a plurality of the vias 136' and 136" may formed through the first microelectronic substrate core 102' and the second microelectronic substrate core 102", respectively.

Figure 21:
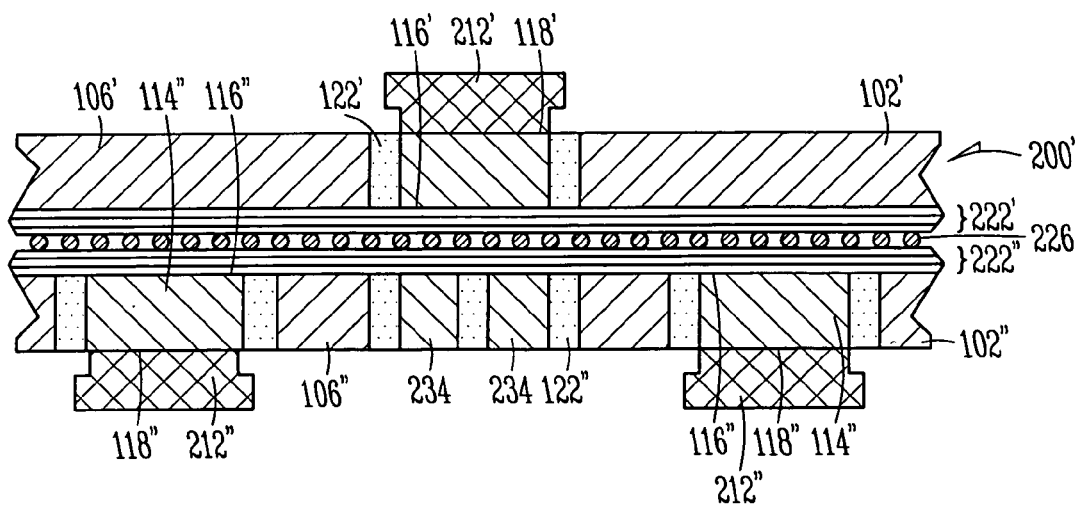
FIG. 21 is an alternate embodiment of the layered microelectronic substrate assembly of FIG. 20, according to the present invention.

It is, of course, understood that the interconnection layers 224' and 224" are optional, as shown in FIG. 21, wherein thermal dissipation devices 212' and 212" may be attached directly to the microelectronic device back surfaces 118' and 118". Further, as shown in FIG. 21, if microelectronic components, such as decoupling capacitors 234, need to be located close to a particular microelectronic device, such as microelectronic device 114'. Thus, they may be positioned within microelectronic substrate assembly 200" directly opposite the microelectronic device 114'. Of course, an equivalent arrangement (not shown) is possible for placing components near dice 212" by embedding them in the opposite microelectronic substrate assembly 200'.

Figure 22:
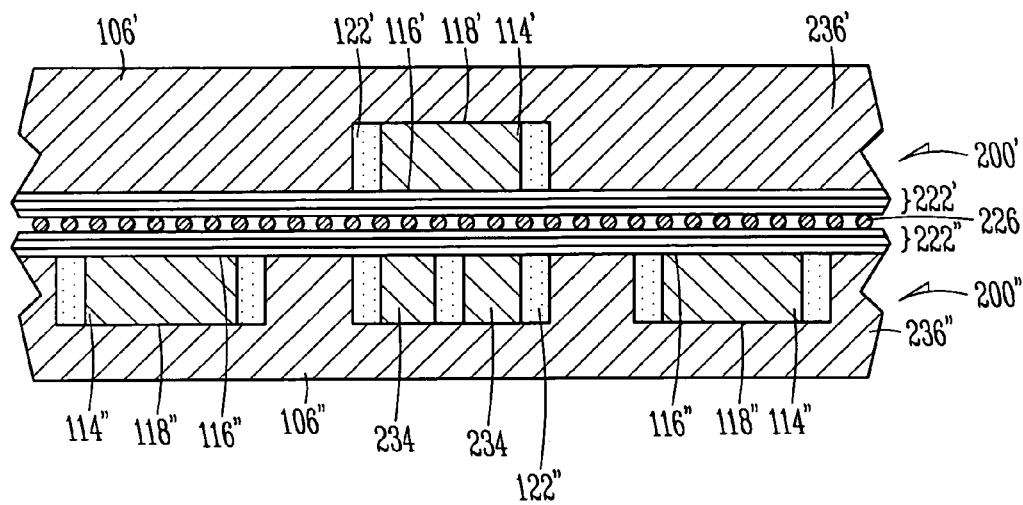
FIG. 22 is an alternate embodiment of the layered microelectronic substrate assembly of FIG. 21, according to the present invention.
Figure 23:
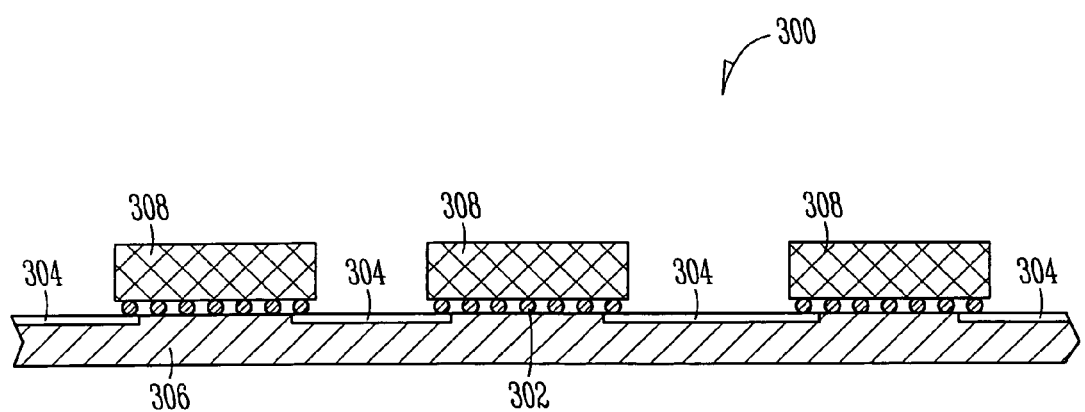
FIG. 23 is a cross-sectional view of a single-sided board, as known in the art.
Figure 24:
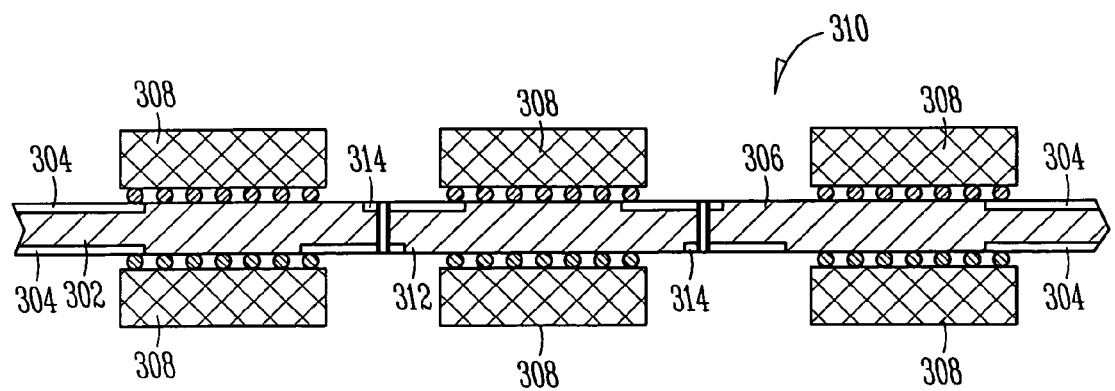
FIG. 24 is a cross-sectional view of a double-sided board, as known in the art.
Figure 25:
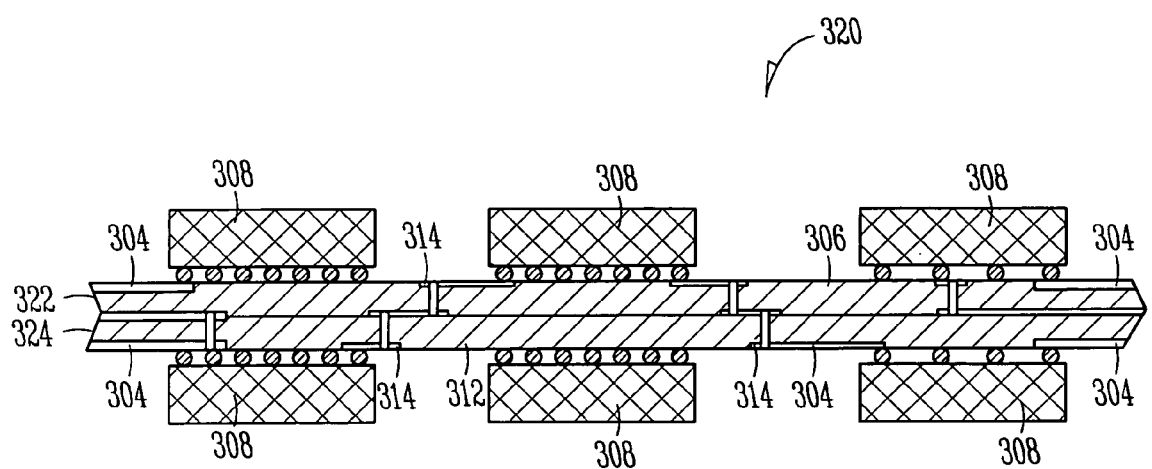
FIG. 25 is a cross-sectional view of a multi-layer board, as known in the art.

Furthermore, as shown in FIG. 22, the heat dissipation devices 212' and 212" and the first microelectronic substrate core 102' and the second microelectronic substrate core 102" may be replaced by a first thermally conductive microelectronic substrate core 236' and a second thermally conductive microelectronic substrate core 236". The microelectronic device 114' is disposed within a cavity in the first thermally conductive microelectronic substrate core 236' and the encapsulation material 122' fills any voids between the microelectronic device 114' and the first microelectronic substrate core 102'. The microelectronic device 114' may be secured with a thermally conductive adhesive or solder, or may merely be secured with the encapsulation material 122'. The microelectronic devices 114" and the microelectronic components 234 are shown likewise situated in cavities in the second thermally conductive microelectronic substrate core 236".

It is understood that the assemblies of FIGS. 17–22 may include external attachment features (see elements 182 in FIG. 16), such as attach pins, solder balls, edge connectors, or other such features (not shown), connected to an external system board (not shown), such as is shown in FIG. 16.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic substrate, comprising:
a first microelectronic substrate core having a first surface and an opposing second surface, said first microelectronic substrate core having at least one opening defined therein extending from said first microelectronic substrate core first surface to said first microelectronic substrate core second surface;
at least one first microelectronic device disposed within said at least one opening, said at least one first microelectronic device having an active surface and a back surface, wherein said first microelectronic device active surface is adjacent said first microelectronic substrate core first surface;
a first encapsulation material adhering said first microelectronic substrate core to said at least one first microelectronic device forming a first surface adjacent said microelectronic die active surface and said core first surface and a second surface adjacent said microelectronic die back surface and said core second surface;
a second microelectronic substrate core having a first surface and an opposing second surface, said second microelectronic substrate core having at least one opening defined therein extending from said second microelectronic substrate core first surface to said second microelectronic substrate core second surface;
at least one second microelectronic device disposed within said at least one opening, said at least one second microelectronic device having an active surface and a back surface, wherein said second microelectronic device active surface is adjacent said second microelectronic substrate core first surface;
a second encapsulation material adhering said second microelectronic substrate core to said at least one second microelectronic device forming a first surface adjacent said microelectronic die active surface and said core first surface and a second surface adjacent said microelectronic die back surface and said core second surface; and
said first microelectronic device active surface oriented to face said second microelectronic device active surface.

2. The microelectronic substrate of claim 1, further including a first interconnection layer disposed proximate said first microelectronic substrate core first surface, said first encapsulation first surface, and said first microelectronic device active surface and further including a second interconnection layer disposed proximate said second microelectronic substrate core first surface, said second encapsulation material first surface, and said first microelectronic device active surface, wherein said first and second interconnection layers are electrically connected.

3. The microelectronic substrate of claim 1, further including an interconnection layer disposed proximate at least one of said first microelectronic substrate core second surface, said first encapsulation material second surface, and said first microelectronic device back surface, and said second microelectronic substrate core second surface, said second encapsulation material second surface, and said second microelectronic device back surface.

4. The microelectronic substrate of claim 1, further including at least one conductive via extending from said first microelectronic substrate core first surface and said first microelectronic substrate core second surface.

5. The microelectronic substrate of claim 1, further including at least one conductive via extending between said second microelectronic substrate core first surface and said second microelectronic substrate core second surface.

6. The microelectronic substrate of claim 1, further including at least one conductive via extending from said first microelectronic substrate core second surface and said second microelectronic substrate core second surface.

7. The microelectronic substrate of claim 1, further including at least one heat dissipation device thermally attached to at least one of said at least one first microelectronic device back surface and said at least one second microelectronic device back surface.

8. A microelectronic substrate, comprising:

a first microelectronic substrate core having a first surface and an opposing second surface, said first microelectronic substrate core having at least one cavity defined therein;

at least one first microelectronic device disposed within said at least one cavity, said at least one first microelectronic device having an active surface and a back surface, wherein said first microelectronic device active surface is adjacent said first microelectronic substrate core first surface;

a first encapsulation material adhering said first microelectronic substrate core to said at least one first microelectronic device forming a first surface adjacent said microelectronic die active surface;

a second microelectronic substrate core having a first surface and an opposing second surface, said second microelectronic substrate core having at least one cavity defined therein;

at least one second microelectronic device disposed within said at least one cavity, said at least one second microelectronic device having an active surface and a back surface, wherein said second microelectronic device active surface is adjacent said second microelectronic substrate core first surface;

a second encapsulation material adhering said second microelectronic substrate core to said at least one second microelectronic device forming a first surface adjacent said microelectronic die active surface and said core first surface; and said first microelectronic device active surface oriented to face said second microelectronic device active surface.

9. The microelectronic substrate of claim 8, further including a first interconnection layer disposed proximate said first microelectronic substrate core first surface, said first encapsulation first surface, and said first microelectronic device active surface and further including a second interconnection layer disposed proximate said second microelectronic substrate core first surface, said second encapsulation material first surface, and said first microelectronic device active surface, wherein said first and second interconnection layers are electrically connected.

* * * * *